United States Patent [19]

Pozzo

[11] 4,300,341

[45] Nov. 17, 1981

[54] HOUSING FOR HOLDING A CONTROL DEVICE WITH HEAT-GENERATING ELEMENTS FOR A THREAD MONITOR OF AN OPEN-END SPINNING STATION

[75] Inventor: Hans Pozzo, Ingolstadt, Fed. Rep. of Germany

[73] Assignee: Schubert & Salzer, Ingolstadt, Fed. Rep. of Germany

[21] Appl. No.: 142,627

[22] Filed: Apr. 22, 1980

[30] Foreign Application Priority Data

Apr. 26, 1979 [DE] Fed. Rep. of Germany ... 7912156[U]

[51] Int. Cl.³ ............................................ D01H 13/16
[52] U.S. Cl. ...................................................... 57/80
[58] Field of Search ....................... 57/80, 78, 81, 264; 73/160

[56] References Cited

U.S. PATENT DOCUMENTS

| | | | |
|---|---|---|---|
| 3,404,524 | 10/1968 | Rajnoha et al. | 57/81 |
| 3,676,990 | 7/1972 | Santerre et al. | 57/81 |
| 3,960,593 | 6/1976 | Heusser | 73/160 X |
| 4,075,445 | 2/1978 | Kempf | 57/81 X |
| 4,100,722 | 7/1978 | Suzuki et al. | 57/80 X |
| 4,112,661 | 9/1978 | Suzuki et al. | 57/80 X |

*Primary Examiner*—Donald Watkins
*Attorney, Agent, or Firm*—Bailey, Dority & Flint

[57] ABSTRACT

A housing for holding a control device for a thread monitor of an open-end spinning machine which includes heat-generating elements. The housing is primarily constructed of plastic material and includes a cooling plate upon which the heat generating elements are mounted for dissipating heat generated within the housing.

14 Claims, 3 Drawing Figures

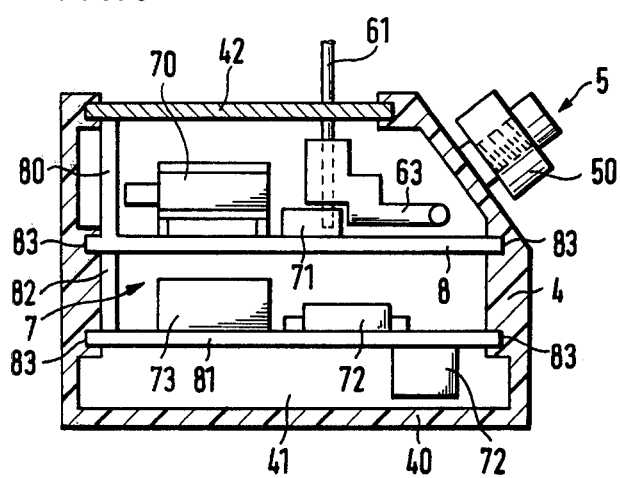

HOUSING FOR HOLDING A CONTROL DEVICE WITH HEAT-GENERATING ELEMENTS FOR A THREAD MONITOR OF AN OPEN-END SPINNING STATION

BACKGROUND OF THE INVENTION

The present invention relates to a housing for holding a control device provided with heat-generating elements for a thread monitor of an open-end spinning station.

In the interests of simple economical manufacture, in practice the switch housing of an open-end spinning station is manufactured mostly of plastic. Such a housing, however, leads to an accumulation of heat if it contains heat-generating elements, and thus leads to considerably reduced durability of these electrical elements. Such a control device in the housing is, for example, provided in the housing, when the feed of fibers is controlled in such a way that the inoperative condition of the fiber feed system can also be maintained when the thread tension sensor is in the position which it assumes when spinning is to commence, or in its readiness condition, in which condition the thread tension sensor lies completely free of the thread outlet pipe and the feed of fibers is normally operative (German Patent Application P 28 55 924.2-26).

SUMMARY OF THE INVENTION

It is the object of the present invention to provide a housing with a control device which contains heat-generating elements, in which no excessive heating of the electrical elements occurs.

In order to be able to produce such housings in a manner which is simple and cheap and yet counteract excessive accumulation of heat as a result of radiation of heat from the heat-generating elements, the housing consisting of plastic material comprises a wall portion which is constructed as a cooling plate, which consists of metal and to which the heat-generating elements of the control device are connected. According to a preferred embodiment of the invention, the cooling plate is constructed as a support for the heat-generating elements. The heat-generating elements may be attached directly or via a holder consisting of metal to the cooling plate, wherein the holder is appropriately formed integrally on the cooling plate. If, for reasons of space, not all the heat-generating elements can be attached to the cooling plate or another single support, according to a further development of the subject of the innovation the heat-generating elements of the control device are attached to plates which are disposed in several planes in the housing and for which the housing appropriately comprises sliding guides. Such plates may be constructed as printed circuits. For the purpose of good removal of heat, the individual plates may comprise webs which consist at least partially of metal, for connection to other plates and/or the cooling plate, or spring metal connections may be provided between the cooling plate and further plates. As the cooling plate consists of a different material to the housing, it may be advantageous if the cooling plate is contructed as a detachable lid. Alternatively or in addition, the or one cooling plate may be cast integrally in the plastic housing. In order to produce a draft of air at the outer surface of the cooling plate without the aid of fans, the cooling plate appropriately forms a side wall of the housing. For better release of heat, the cooling plate may according to a further characteristic of the invention comprise lamellae on the outside. Preferably, the housing is attached to a support consisting of metal, wherein the cooling plate comprises a section provided for lying adjacent to the support. Appropriately, the housing has a screw fitting consisting of metal for attachment to the support consisting of metal, wherein between the screw fitting and the cooling plate is provided a metal bridge. In this way, even better release of heat is obtained.

The invention is explained in more detail below with the aid of drawings.

BRIEF DESCRIPTION OF THE DRAWINGS

FIG. 3 shows a modification of the device shown in FIG. 2, also in side view with a side wall removed.

DESCRIPTION OF A PREFERRED EMBODIMENT

Figure 1:
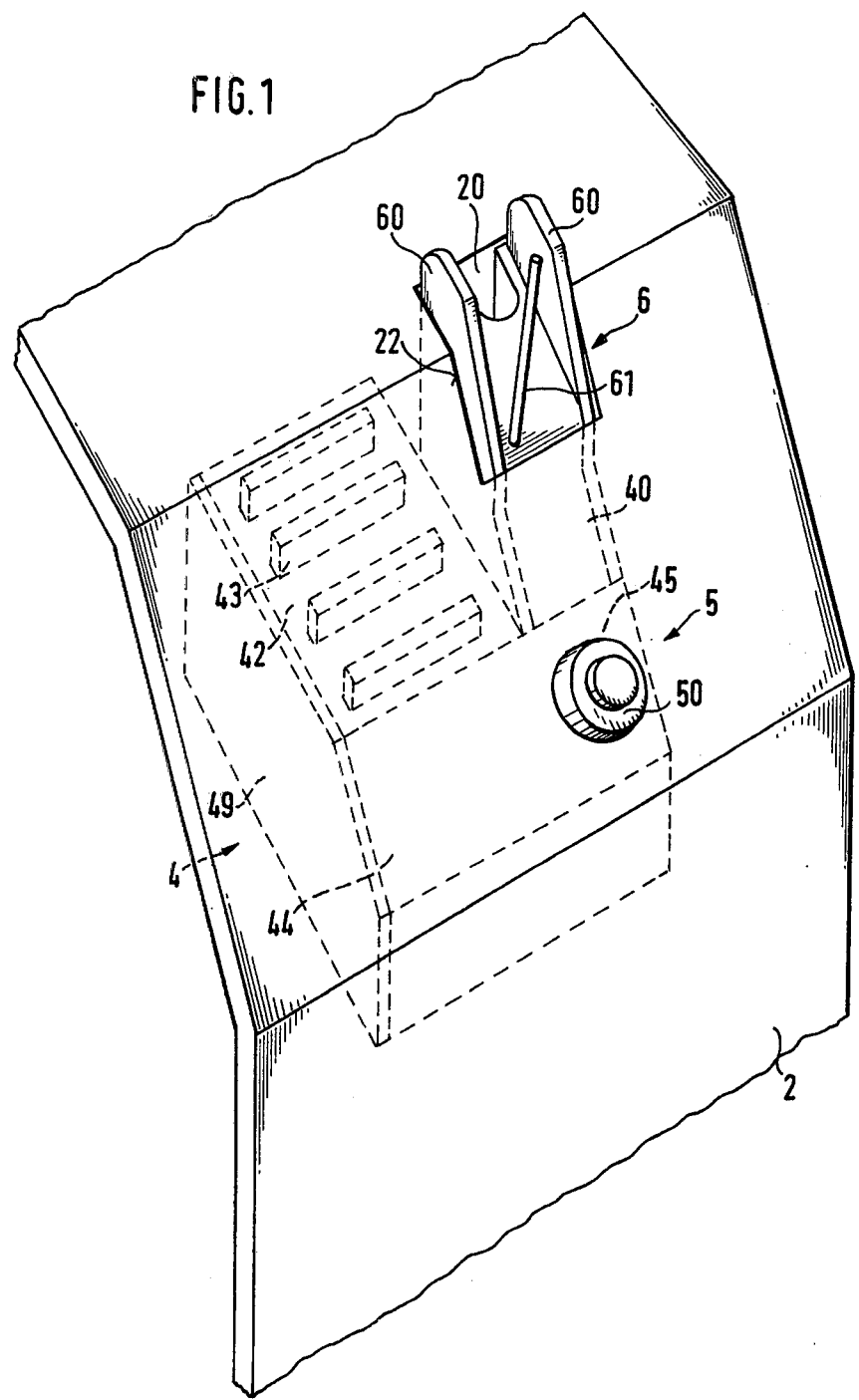
FIG. 1 shows part of the cover with the housing constructed according to the invention.
Figure 2:
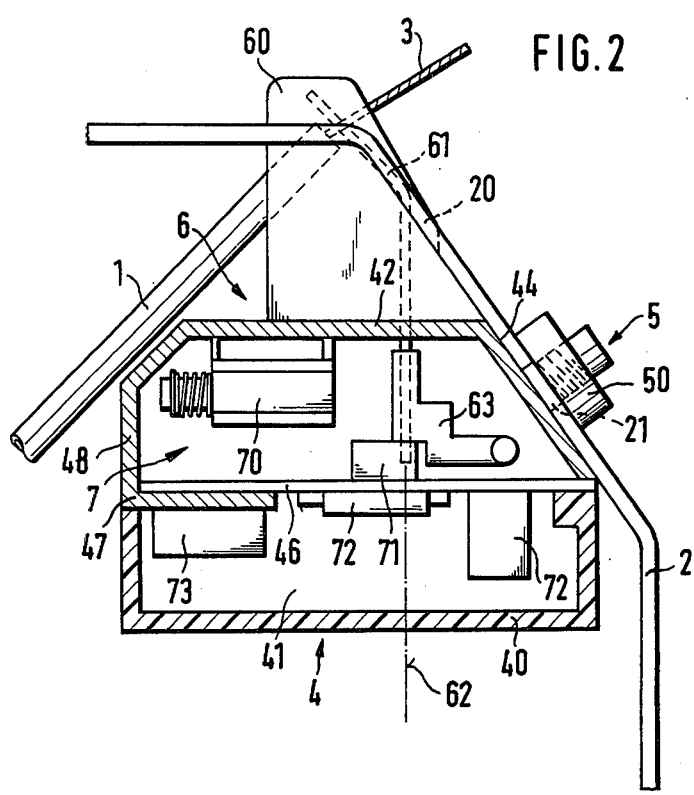
FIG. 2 shows a side view of the housing with a side wall removed.

The conventionally constructed spinning station, of which only the upper opening of the thread outlet pipe 1 is shown in FIG. 2, is covered during production of the thread 3 by a folding cover 2. The cover has a recess 20 through which extend two parallel spaced-apart ribs 60 which are disposed on both sides of the thread path and closely surrounded by the side edges 22 of the recess 20. (FIG. 1)

The ribs are an integral part of a housing 4 which carries a switching member 5 which in a known manner serves to control a fiber feed device, not shown. The switching member 5 extends through an opening 21 in the housing 4 which is so small that it closely surrounds the switching member 5. In this way, the recess 20 and the opening 21 position the housing 4, so that it is perfectly adjusted both in its position and in its orientation. This is of important for perfect functioning of the thread monitor 6 provided in the housing 4, in order that the thread tension forces necessary to actuate the thread monitor 6 also actually coincide with the forces calculated for actuation of the thread monitor 6. This is the case as a rule when the thread tension forces also actually act on the thread tension sensor 61 in the direction provided.

Up to now, application of the housing 4 to the cover 2 has been relatively protracted, as the threaded holes in the housing 4 and the corresponding holes in the cover 2 are relatively small, and the surfaces of the housing 4 and cover 2 lie on top of each other without being able to fix a particular relative position. The ribs 60 and the associated recess 20 in the cover 2 on the other hand, are of relatively large surface area, so that the ribs can be introduced into the recess without difficulty. Attachment of the housing 4 to the cover 2 now poses no problems as the threaded holes in the housing 4 and holes in the cover 2 serving for attachment now necessarily lie one above the other on account of the attachments which effect adjustment and which are formed by the ribs 60 on the one hand and the switching member 5 on the other hand. Due to the provision of ribs 60 and the recess 20 coacting with them, and the switching member 5 and opening 21 coacting with it, the housing 4 is functionally adapted to the support which is constructed as a cover 2.

In the embodiment described, the first attachment of the housing 4 is constructed in the form of two parallel ribs 60 between which is located the thread tension sensor 61. The thread tension sensor 61 is thus protected against external influences, so that undesired pivoting of the thread tension sensor 61 is prevented.

The thread tension sensor 61 is rotatable about a pivot axis 62 in the embodiment shown, wherein the thread tension sensor 61 crosses the direction of thread tension. Therefore, the pivot axis 62 is disposed in the vicinity of one rib 60, while the free end of the thread tension sensor 61 lies adjacent to the other rib 60 in the absence of thread tension. This other rib 60 thus acts as a path limiting stop.

To begin spinning, the thread tension sensor 61 is moved into its ready position, in which it lies adjacent to the rib 60 in the vicinity of which its pivot axis 62 is disposed, so that it frees the thread outlet pipe 1 and hence introduction of the thread 3 into the thread outlet pipe 1 is facilitated substantially. This rib 60 thus acts as a path limiting stop.

When thread tension exists, the thread tension sensor 61 is located in its central position in which it does not touch either of the two ribs 60.

In order that the ribs 60 can also actually act as path limiting stops, they project above the path of travel of the thread tension sensor 61 and accordingly, stand close to each other.

Since as a rule an additional guide for the switching member 5 apart from the guide in the housing 4 is desirable, in the embodiment shown in the illustrations the first attachment is formed by providing for the switching member 5 a screw fitting 50 which extends through the cover 2 and is constructed so strong that by means of this screw fitting 50 the housing 4 can be attached to the cover 2. In this way, separate attachment by screws becomes superfluous, for which additional threaded holes in the housing 4 and holes in the cover 2 would have to be provided, so that by application of a screw fitting to the switching member 5, further attachment of the housing 4 to the cover 2 takes place.

The subject of the invention was described from the example of the housing 4 of a thread monitor 6 which is mounted on a cover 2 covering the spinning station. Instead of the cover 2 however, a different support may also be provided for the housing 4, depending on the construction of the spinning apparatus.

In the example illustrated with the aid of the drawings, the second attachment is formed by two parallel ribs 60 between which is located the thread tension sensor 61. Such a construction is of course, particularly advantageous, but it is also possible to construct the second attachment differently, e.g. in cylindrically or otherwise shaped projection.

In the interests of simple economical manufacture, the housing 4 advantageously consists of plastic. This does not as a rule cause any problems, as the switching member 5 and the thread monitor 6 do not become heated during operation thereof, so that no accumulation of heat occurs in the housing 4.

In the housing 4 however, there may also be disposed, apart from the thread monitor 6 with the thread tension sensor 61 and the switching member 5, for control of the fiber feed device, not shown, a control device 7 with further electrical elements of which one or more generate a particularly large amount of heat. For example, a repelling magnet 70 is provided which is approached by a magnetically controllable lug 63 of the thread tension sensor 61 when a thread breakage occurs. In the process a contactless switch 71 is actuated which interrupts fiber feeding and excites the repelling magnet 70 which, immediately after a thread breakage occurs, pivots the thread tension sensor 61 until it lies adjacent to one of the ribs 60, in which position the thread tension sensor 61 releases the opening of the thread outlet pipe 1.

The repelling magnet 70, during its excitation, generates heat which heats the inner chamber of the housing 4 and may lead to damage to the repelling magnet 70 or other electrical elements 72 located in the housing 4.

In order to prevent damage to these parts, the housing 4 consists of a plastic part 40 which contains an inner chamber 41 holding the control device 7, but has a cooling plate 42 which is attached to this plastic part 40 and which consists of metal. Connected to this cooling plate are the heat-generating elements of the control device 7 such as e.g., the repelling magnet 70. In the example shown, the cooling plate 42 is constructed as a support for the repelling magnet 70, i.e. the heat-generating elements. The heat which occurs is immediately released by these elements (70) to the cooling plate 42 which reflects the heat to the atmosphere surrounding it. To improve this reflective effect, the cooling plate 42 according to FIG. 1, has lamellae 43 on the outside.

A further improvement in removal of heat is obtained if the support, for example the cover 2, consists of metal and the cooling plate 42 comprises a section 44 which lies adjacent to this support.

In order to render possible particularly good abutment of the section 44 with the support consisting of metal and particularly good removal of heat by the cover, the screw fitting 50 of the switching member 5 consists at least partially of metal, wherein this part of the screw fitting 50 consisting of metal is connected via a metal bridge 45 to the cooling plate 42. The improved removal of heat takes place in this case by the improved contact between the section 44 of the cooling plate 42 and the support on the one hand and between the part of the screw fitting 50 connected to the cooling plate 42 and the support on the other hand. In this way too, functional adaptation of the housing 4 to the support is improved.

The control device 7 may however, also comprise further heat-generating elements, e.g. a thyristor 73, which in the interests of a compact housing shape may not be disposed in the same plane in the housing 4 as the repelling magnet 70 (see FIG. 2). The housing 4 in this case comprises an intermediate panel 46 which is appropriately constructed in the manner of a printed circuit and connects the electrical elements 72 and the thyristor 73 to each other electrically. On the cooling plate 42 is integrally formed a holder 47 for the thyristor 73, via a metal web 48. The heat generated by the thyristor 73 is therefore conducted away via the holder 47 and the metal web 49 to the cooling plate 42, which in the manner already described, releases the heat to the atmosphere or via the support to other machine parts.

As the above description shows, the subject of the application can be modified in many ways. The two attachments serve to adjust the housing 4 and hence the thread tension sensor 61. If the switching member 5 at the same time comprises a screw fitting 50, this may, apart from adjusting means, also act as fastening means for the housing 4. Provision of the switching member 5 with a screw fitting 50 improves abutment of the housing 4 with the support. If the housing 4 is provided with a cooling plate 42 and furthermore if the support consists of metal, such a construction offers the possibility of particularly good removal of heat, although the actual housing 4 has a plastic part 40 containing the inner chamber 51. In all the cases described above, functional adaptation of the housing 4 to the support is obtained, which is constructed as a cover 2 for example.

According to a preferred embodiment of the invention, the side wall of the housing 4 forming a detachable lid is constructed as a cooling plate 49, instead of or in addition to cooling plate 42. This cooling plate 49 too is in contact with the metal support carrying the heat-generating elements 70 and 73. This design also has the advantage that the air heated by reflection of heat on the outside of the cooling plate 49 rises, whereby as a result of the movement of air and exchange of air, particularly good removal of heat is effected. This removal of heat may be further accelerated by the lamellae 43 being attached to this cooling plate 49.

FIG. 3 shows another embodiment of the subject according to the invention. In the plastic part 40 of the 4, the cooling plate 42 is cast integrally. Connected to the cooling plate 42 via a web 80 is a plate 8. The plate 8 may be constructed as a printed circuit, but comprises, at least in the region in which it carries a heat-generating element e.g., the repelling magnet 70, a metal coating which is connected via the web 80 to the cooling plate 42. The web 80 either consists of metal or comprises a metal coating. The other heat-generating element e.g. the thyristor 73 is seated on another plate 81 which is connected to the plate 8 via a web formed integrally on the plate 81 or by way of a spring metal connection 82 which is clamped between the plate 8 and the plate 81. With the aid of such plates 8 and 81, the heat-generating elements can be arranged in several planes in a particularly simple manner.

In the embodiment shown in FIG. 3, the housing 4 comprises sliding guides 83 for the plates 8 and 81, which substantially facilitates assembly of the housing 4, as the electrical connections can be made when the plates 8 and 81 are still located completely or partly outside the housing 4.

While a preferred embodiment of the invention has been described using specific terms, such description is for illustrative purposes only, and it is to be understood that changes and variations may be made without departing from the spirit or scope of the following claims.

I claim:

1. A plastic housing for supporting heat-generating elements (70, 73) forming part of a control device (7) associated with a thread monitor of an open-end spinning station comprising:
    a wall portion of said housing being constructed of metal providing a cooling plate,
    said heat generating elements (70, 73) being connected to said metal wall portion so that heat generated by said heat generating element can be dissipated through said metal wall portion.

2. The housing as set forth in claim 1 further comprising:
    said cooling plate being constructed as a support for said heat-generating elements (70, 73).

3. The housing as set forth in claim 1 further comprising:
    a metal holder (48) attaching said heat generating elements (70, 73) to said cooling plate (42).

4. The housing as set forth in claim 3 further comprising:
    said holder (48) being formed integrally with the cooling plate (42).

5. The housing according to claim 1 further comprising:
    said metal wall portions including a plurality of plates disposed in several planes in said housing (4).

6. The housing as set forth in claim 1 further comprising sliding guides (83) provided in said plastic housing, and
    said plurality of plates being supported in respective guides of said housing.

7. The housing as set forth above in claim 5 further comprising:
    metal webs 80 connecting said plurality of plates.

8. The housing as set forth above in claim 7 further comprising:
    said metal webs being constructed of spring metal.

9. The housing as set forth above in claim 1 further comprising:
    said cooling plate (42, 49) forming a detachable lid for said housing.

10. The housing as set forth above in claim 1 further comprising:
    said cooling plates (42) being cast integrally in said plastic housing (4).

11. The housing as set forth in claim 1 further comprising lamellae (43) provided on the outside of said cooling plate.

12. The housing as set forth in claim 1 further comprising:
    a metal support, said housing (4) being attached to said metal support, and a section (44) of said cooling plate (42) lying adjacent to said support (2).

13. The housing as set forth in claim 12 further comprising:
    a metal screw fitting extending through said support (2) and said cooling plate (42) attaching same together.

14. The housing as set forth in claim 1 wherein said cooling plate (49) forms a side wall of the housing (4).

* * * * *